(12) United States Patent
Kim

(10) Patent No.: US 6,864,178 B1
(45) Date of Patent: Mar. 8, 2005

(54) METHOD OF MAKING A MOS TRANSISTOR

(75) Inventor: Young Pil Kim, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/627,059

(22) Filed: Jul. 25, 2003

(30) Foreign Application Priority Data

Jul. 25, 2002 (KR) .............................. 10-2002-0043796

(51) Int. Cl.$^7$ ..................... H01L 21/302; H01L 21/461
(52) U.S. Cl. ..................... 438/692; 438/581; 438/655
(58) Field of Search ............................... 438/297, 581, 438/592, 655, 660, 663–664, 682

(56) References Cited

U.S. PATENT DOCUMENTS

| | | | |
|---|---|---|---|
| 5,726,477 A | 3/1998 | Williams et al. | 257/402 |
| 5,792,699 A | 8/1998 | Tsui | 438/290 |
| 5,920,774 A | 7/1999 | Wu | 438/224 |
| 6,008,099 A | 12/1999 | Sultan et al. | 438/305 |
| 6,153,520 A | 11/2000 | Chen | 438/682 |
| 6,214,656 B1 | 4/2001 | Liaw | 438/199 |
| 6,221,746 B1 | 4/2001 | Huang et al. | 438/592 |
| 6,323,094 B1 | 11/2001 | Wu | 438/303 |
| 6,524,939 B2 * | 2/2003 | Tseng | 438/592 |
| 6,630,721 B1 * | 10/2003 | Ligon | 257/413 |
| 2004/0038435 A1 * | 2/2004 | Wieczorek et al. | 438/13 |

FOREIGN PATENT DOCUMENTS

| | | |
|---|---|---|
| KR | 1019990066930 | 12/1999 |
| KR | 1020000019690 | 4/2000 |
| KR | 1020000048326 | 8/2000 |

* cited by examiner

*Primary Examiner*—Phat X. Cao
*Assistant Examiner*—Theresa T. Doan
(74) *Attorney, Agent, or Firm*—Hanley, Flight & Zimmerman, LLC

(57) ABSTRACT

A method of making a MOS transistor is disclosed. The disclosed techniques can completely transform a polysilicon gate electrode into a metal silicide electrode through a brief thermal treatment process by extending the contact area between the polysilicide gate electrode and a metal layer prior to a formation of a metal silicide. The disclosed MOS transistor fabricating method comprises providing a semi-conductor substrate further comprising a polysilicon gate electrode with a silicide layer thereon, a spacer, and source and drain regions with LDD regions; forming an insulating layer on the area of the substrate; polishing the insulating layer so that the top of the polysilicon gate electrode can be exposed; etching some part of the insulating layer and the spacer so that both lateral walls of the polysilicon gate electrode can be exposed; forming a metal layer on the substrate resulted from the preceding step so that the polysilicon gate electrode can be covered with the metal layer; and transforming completely the polysilicon gate electrode into a metal silicide gate electrode by performing a thermal treatment process.

6 Claims, 4 Drawing Sheets

-- PRIOR ART --

-- PRIOR ART --

-- PRIOR ART --

METHOD OF MAKING A MOS TRANSISTOR

TECHNICAL FIELD

The present disclosure relates to semiconductors and, more particularly, to a method of making a metal-oxide-semiconductor (MOS) transistor.

BACKGROUND

As MOS devices have been integrated at a rapid speed, an existing process using polysilicon as a gate electrode has caused many problems such as high gate resistance, depletion of polysilicon, and boron penetration into a channel area. Such problems have been solved by a process including a metal gate electrode. However, the process of forming a metal gate has caused new problems, such as difficulty in etching a metal and limitations in enduring high-temperature thermal treatment.

Accordingly, a damascene process has been proposed to solve such problems. However, the damascene process uses a chemical mechanical polishing (CMP) process repeatedly, thereby complicating the process, although CMP solved the problems of an existing metal gate process.

To obviate such process complexity, a method of making a MOS transistor using a single CMP process has been proposed. Reference will now be made in detail to a known MOS transistor fabricating method using a single CMP process, examples of which are illustrated in the accompanying drawings. FIGS. 1a through 1c are cross-sectional views illustrating a MOS transistor fabricated according to a known process. Referring to FIG. 1a, a polysilicon gate electrode 5 is formed on a semiconductor substrate 1, and lightly doped drain (LDD) regions 2 are formed on the substrate 1 at both sides of the polysilicon gate electrode 5. Then, a spacer 6 is formed on both lateral walls of the polysilicon gate electrode 5, and source and drain regions 3 are formed on the substrate 1 at both sides of the polysilicon gate electrode 5. Subsequently, a silicide layer 7 is coated on the top of the polysilicon gate electrode 5 and the surface of the source and drain regions 3, and a nitride layer 8 is formed on the entire area of the semiconductor substrate having the source and drain regions 3 and the LDD regions 2 so that the polysilicon gate electrode 5 can be covered. Next, an insulating layer 9 is formed on the nitride layer 8. The nitride layer 8 is usually between about 300 and about 1000 Å in thickness, and is formed by a plasma enhanced chemical vapor deposition (PECVD) process.

Next, referring to FIG. 1b, the nitride layer 8 and the insulating layer 9 are polished by a CMP process until the top of the polysilicon gate electrode 5 is exposed. The CMP process is performed by over polishing so that the top of the polysilicon gate electrode 5, in uniform thickness, can be exposed completely. Then, a metal layer 10 is deposited, in uniform thickness, on the exposed region of the polysilicon gate electrode 5, the nitride layer 8 and the insulating layer 9. The metal layer 10 is usually less than about 1000 Å and, in some cases, may be between about 500 and about 1000 Å in thickness. The metal layer 10 may be a multilayer of Ti/TiN, Co/TiN, or Co/Ti/TiN.

Referring to FIG. 1c, a thermal treatment is performed on the substrate having the metal layer 10 to transform the polysilicon gate electrode 5 into a metal silicide gate electrode 7. The thermal treatment process may be performed through two steps, i.e., a first step at a temperature of about 400° C. to about 600° C., and a second step using a rapid thermal process (RTP) at a temperature of about 800° C. to about 1000° C. Subsequently, the residual metal layer, which has not reacted, is removed.

However, such a method of fabricating a MOS transistor cannot completely transform the polysilicon gate electrode 5 into the metal silicide gate electrode 7 because the area where the metal of the metal layer can be diffused while performing the thermal treatment is insufficient due to the small contact area between the polysilicon gate electrode 5 and the metal layer 10. To obviate such a disadvantage, the thermal treatment process to form the metal silicide gate electrode 7 has to be performed for many hours. However, such a long thermal treatment may cause deterioration of device characteristics because an impurity implanted in source and drain regions 3 may be diffused irregularly.

DETAILED DESCRIPTION

As disclosed herein, a polysilicon gate electrode may be completely transformed into a metal silicide gate electrode by performing a thermal treatment process for a short time because the exposed area of the polysilicon gate electrode, which is in contact with the metal layer, is increased prior to performing the silicide process.

Figure 1A:
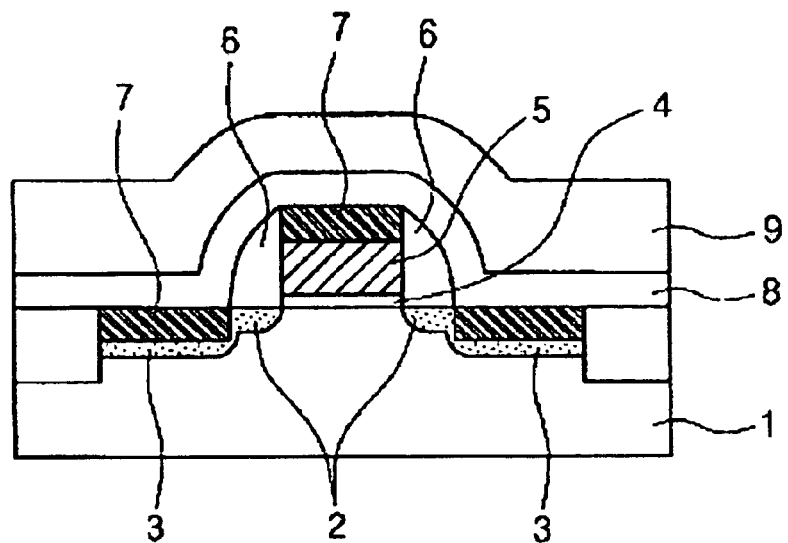
FIGS. 1a through 1c are cross-sectional views illustrating a known process of fabricating a MOS transistor.
Figure 1B:
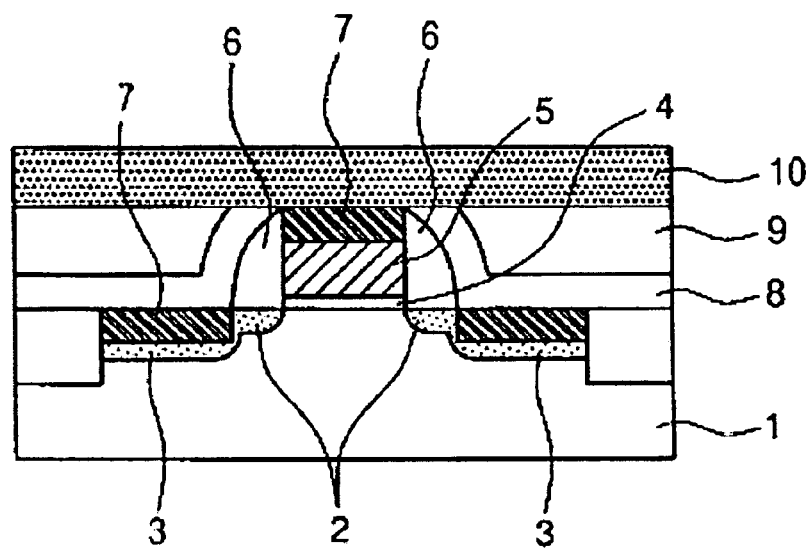
Figure 1C:
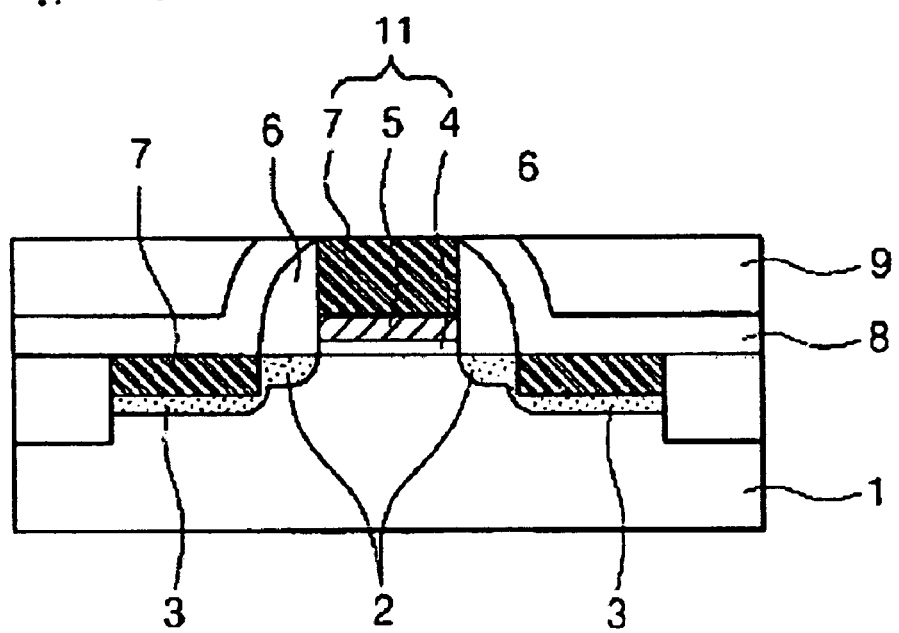
Figure 2A:
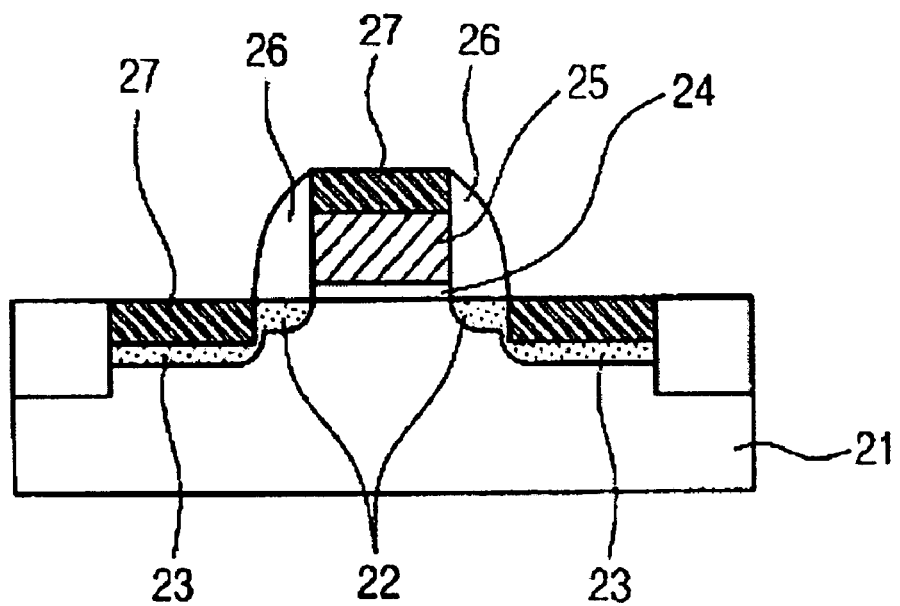
FIGS. 2a through 2e are cross-sectional views illustrating the disclosed process of fabricating a MOS transistor.

Referring to the example of FIG. 2a, a gate oxide 24 and a polysilicon gate electrode 25 are formed on a semiconductor substrate 21. Then, LDD regions 22 are formed on the surface of the substrate at both sides of the polysilicon gate electrode 25. A spacer 26 is formed on both lateral walls of the polysilicon gate electrode 25, and source and drain regions 23 are formed on the surface of the substrate at both sides of the polysilicon gate electrode 25 including the spacer 26. A self-aligned silicide layer 27 is formed on the top of the polysilicon gate electrode 25 and on the surface of the source and drain regions 23.

Figure 2B:
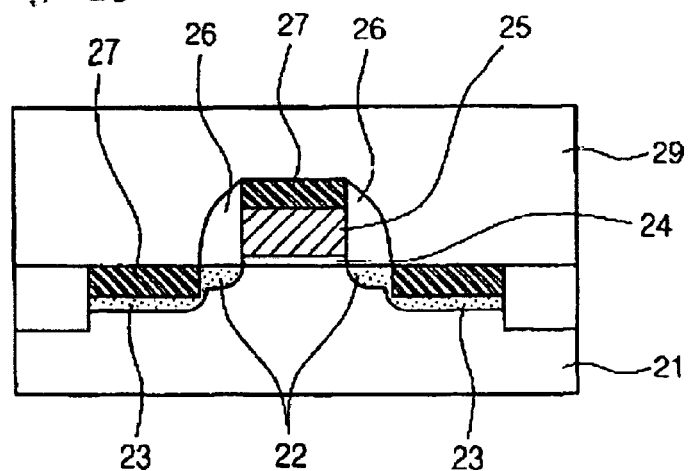

As shown in the example of FIG. 2b, the entire area of the semiconductor substrate 21 including the polysilicon gate electrode 25 and source and drain regions 23 are coated with an insulating layer 29. The insulating layer 29 may be formed by using the same material as the spacer 26.

Figure 2C:
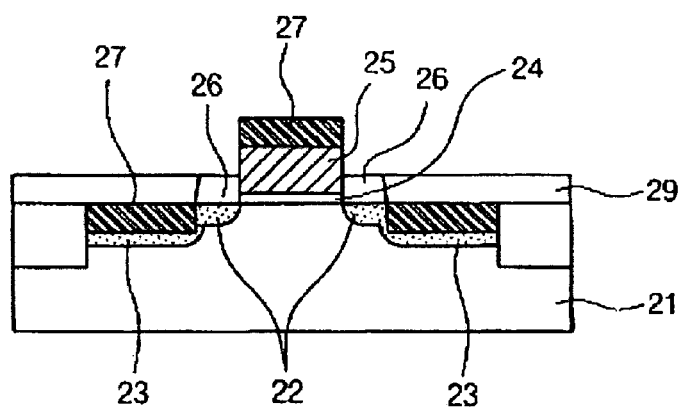

Referring to FIG. 2c, the insulating layer 29 is polished by, for example, a CMP process until the top of the polysilicon gate electrode 25 is exposed. Then, some part of the insulating layer 29 and the spacer 26 are etched by the method of dry-etching and/or wet-etching until the polysilicon gate electrode 25 is exposed to more than about ⅔ of its height. In one particular example, the polysilicon gate electrode 25 is exposed from about ⅘ to about ⅚ of its height. Accordingly, as explained below, as the exposed area of the polysilicon gate electrode 25 is increased, the contact area between the polysilicon gate electrode 25 and a metal layer 30 is expanded, and the polysilicon gate electrode 25 can be completely transformed into a metal silicide gate electrode 31.

Figure 2D:
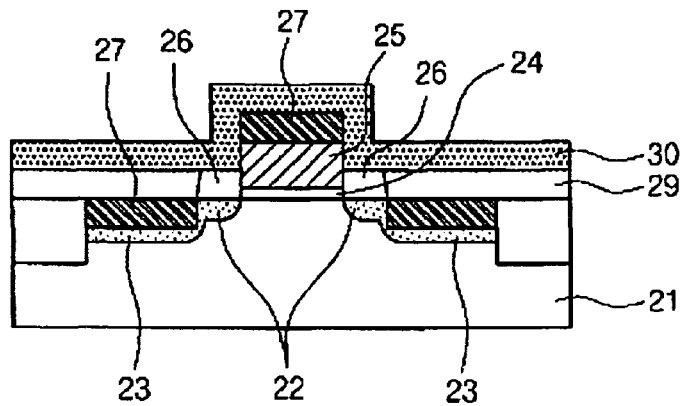

Next, referring to FIG. 2d, the entire area of semiconductor substrate shown in FIG. 2c is coated with a metal layer 30 of uniform thickness. In one example, the metal layer 30 is less than about 1000 Å thick and may be, for example, between about 500 and about 1000 Å in thickness. The metal layer 30 may be a multilayer comprising transition metals and their alloys such as, for example, Ti/TiN, Co/TiN, or Co/Ti/TiN.

Figure 2E:
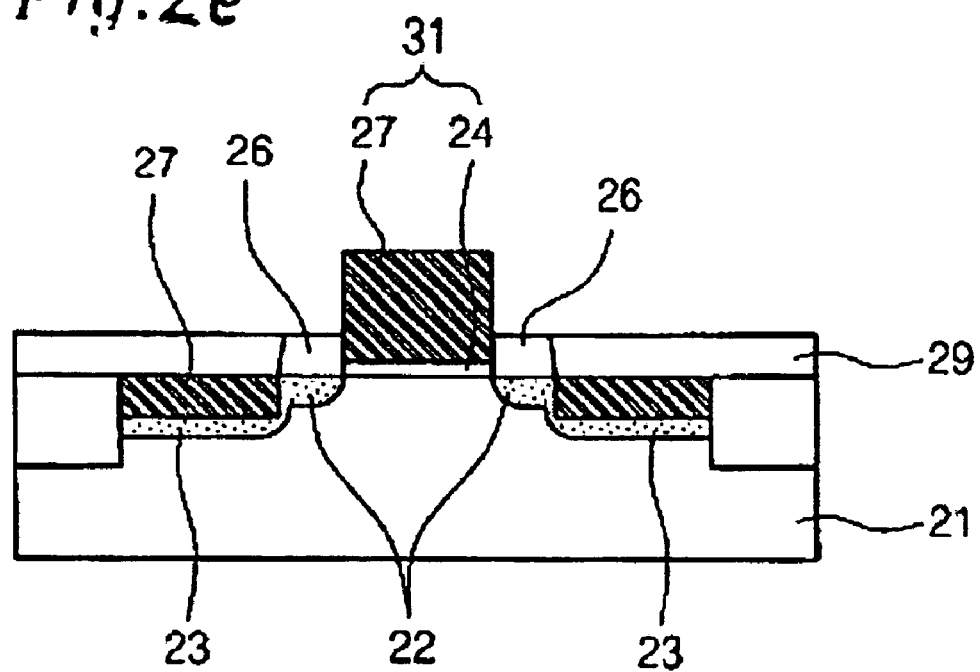

Finally, referring to FIG. 2e, a thermal treatment process is performed on the substrate coated with the metal layer 30 to transform completely the polysilicon gate electrode 25 into a metal silicide gate electrode 31. The thermal treatment may be a rapid thermal process and may be performed through two steps, i.e., a first step at a temperature of about 400° C. to about 600° C., and a second step using RTP at a temperature of about 800° C. to about 1000° C.

As described previously, the contact area between the metal layer and the polysilicon gate electrode is increased because the exposed area of the polysilicon gate electrode is extended or expanded prior to the formation of the metal layer. Therefore, the polysilicon gate electrode reacts actively with the metal layer, and can be completely transformed into the metal silicide electrode. Subsequently, the residual metal layer that has not reacted is removed to complete a disclosed MOS transistor. Accordingly, the disclosed techniques can completely transform the polysilicon gate electrode into the metal silicide electrode through a brief thermal treatment process by extending the contact area between the polysilicide gate electrode and the metal layer prior to the formation of the metal silicide.

The disclosed techniques may be used to produce MOS transistors, each having a gate oxide, a spacer and a gate electrode the top and some part of lateral walls of which are exposed. In addition, the MOS transistor further includes a metal layer that is made of transition metals and their alloys. The disclosed MOS transistors each have a gate electrode that is fully silicided.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of making a MOS transistor, the method comprising:

providing a semiconductor substrate comprising a polysilicon gate electrode with a silicide layer thereon, a spacer which is formed on both lateral walls of said polysilicon gate electrode, and source and drain regions with lightly doped drain regions which are formed at both sides of said polysilicon gate electrode;

forming an insulating layer on the area of said substrate including said polysilicon gate electrode;

polishing said insulating layer so that the top of said polysilicon gate electrode is exposed;

etching some part of said insulating layer and said spacer so that both lateral walls of said polysilicon gate electrode are exposed;

forming a metal layer on said substrate resulted from the preceding step so that said polysilicon gate electrode is covered with said metal layer; and transforming completely said polysilicon gate electrode into a metal silicide gate electrode by performing a thermal treatment process for said substrate coated with said metal layer.

2. A method as defined by claim 1, wherein said spacer and said insulating layer comprise the same material.

3. A method as defined by claim 1, wherein said insulating layer and said spacer are etched until said polysilicon gate electrode is exposed to between about $4/6$ and about $5/6$ of its height.

4. A method as defined by claim 1, wherein said metal layer comprises a multilayer including transition metals and their alloys.

5. A method as defined by claim 1, wherein said thermal treatment process comprises one or more steps of a rapid thermal process.

6. A method as defined by claim 1, wherein said thermal treatment process is performed at the temperature between about 400° C. and about 600° C. in a first step and between about 800° C. and about 1000° C. in a second step.

* * * * *